United States Patent [19]

Schlosser

[11] Patent Number: 4,775,607
[45] Date of Patent: Oct. 4, 1988

[54] LIGHT-SENSITIVE MIXED DIAZONIUM CONDENSATE PRINTING PLATE FOR WATERLESS OFFSET PRINTING

[75] Inventor: Hans-Joachim Schlosser, Wiesbaden, Fed. Rep. of Germany

[73] Assignee: Hoechst Aktiengesellschaft, Fed. Rep. of Germany

[21] Appl. No.: 943,034

[22] Filed: Dec. 17, 1986

[30] Foreign Application Priority Data

Dec. 20, 1985 [DE] Fed. Rep. of Germany ....... 3545204

[51] Int. Cl.$^4$ .......................... G03C 1/54; G03C 1/60; G03C 1/76; G03F 7/08
[52] U.S. Cl. .................................... 430/162; 430/155; 430/157; 430/303
[58] Field of Search ................ 430/162, 155, 157, 303

[56] References Cited

U.S. PATENT DOCUMENTS

| | | | |
|---|---|---|---|
| 3,849,392 | 11/1974 | Steppan | 260/141 |
| 3,867,147 | 2/1975 | Teuscher | 430/157 |
| 4,631,245 | 12/1986 | Pawlowski | 430/175 |

FOREIGN PATENT DOCUMENTS

| | | |
|---|---|---|
| 1217723 | 12/1970 | United Kingdom . |
| 1388489 | 3/1975 | United Kingdom . |
| 1423216 | 2/1976 | United Kingdom . |
| 1444381 | 7/1976 | United Kingdom . |
| 1442374 | 7/1976 | United Kingdom . |
| 1540573 | 2/1979 | United Kingdom . |

*Primary Examiner*—Charles L. Bowers, Jr.
*Attorney, Agent, or Firm*—Foley & Lardner, Schwartz, Jeffery, Schwaab, Mack, Blumenthal, and Evans

[57] ABSTRACT

A light-sensitive printing plate for waterless offset printing is comprised of a layer carrier, a light-sensitive layer containing a diazonium salt polycondensation product, and of an ink-repellent crosslinked silicone elastomer layer superimposed on the light-sensitive layer, wherein the diazonium salt polycondensation product comprises recurrent A-N$_2$X and B units which are mutually linked by bridge members, preferably methylene groups, derived from carbonyl compounds capable of condensation, A being the radical of an aromatic diazonium compound capable of condensation with formaldehyde and B being the radical of a compound, in particular an aromatic amine, a phenol, a phenol ether, an aromatic thioether, an aromatic hydrocarbon, an aromatic heterocyclic compound or an organic acid amide, that is free of diazonium groups and that is capable of condensation with formaldehyde. The printing plate can be readily developed with developers which contain organic solvents, to give printing forms with good resolution, good ink repellency in the background areas, and long print runs.

11 Claims, No Drawings

LIGHT-SENSITIVE MIXED DIAZONIUM CONDENSATE PRINTING PLATE FOR WATERLESS OFFSET PRINTING

BACKGROUND OF THE INVENTION

The present invention relates to a light-sensitive printing plate that comprises a layer carrier, a light-sensitive layer provided on the carrier, and an ink-repellent layer, comprised of a silicone elastomer, which is superimposed on the light-sensitive layer.

Printing plates that include a silicone elastomer, ink-repellent layer are known, for example, from German Offenlegungsschrift No. 1,671,637. The light-sensitive layers used in such plates are preferably those based on polycondensation products of aromatic diazonium salts and formaldehyde. Upon exposure, these layers become insoluble in the developer and can be developed with aqueous solutions. During development, those areas of the silicone elastomer layer which are located above the soluble, unhardened areas of the light-sensitive layer are removed together with these soluble areas, even though the elastomer-layer areas are insoluble in the developer. It is necessary, however, to add sufficient quantities of organic solvents to the developer, so that the silicone elastomer exposed to the developer becomes swollen, and thus softened. For example, mixtures of isopropanol and water are used for development.

The silicone elastomers used for this purpose are single-component elastomers which, for hardening after application of the layer, require moisture and take a considerable length of time. Such single-component silicone elastomers are usually polysiloxanes; for example, dimethylpolysiloxanes, which contain terminal acetyl, oxime, hydroxyl or amino groups.

German Offenlegungsschrift No. 2,323,972 discloses a similar plate with a single-component silicone elastomer, wherein the light-sensitive layer contains (1) a reaction product obtained from a diphenylamine-4-diazonium salt/formaldehyde condensation product and 2-hydroxy-4-methoxy-benzophenone-5-sulfonic acid; and (2) a binder, if appropriate. Since the solubility of the diazonium salt precipitation product is very low, both the preparation and the development of the plate are made considerably more difficult.

In German Offenlegungsschrift No. 2,357,871, presensitized printing plates for waterless offset printing are also disclosed which contain a multicomponent silicone elastomer layer. In addition to organopolysiloxanes, these layers contain, for example, low-molecular silanes which are capable of reacting with functional end groups of the polysiloxanes to effect crosslinking in the absence of moisture. These multicomponent systems can crosslink by means of addition reactions or condensation reactions. In the addition type, for example, terminal alkenyl groups react with Si-H groups in the presence of catalysts at an elevated temperature. In the condensation-crosslinking systems, terminal functional groups of polydiorganosiloxanes react with functional groups of silanes or oligosiloxanes which act as crosslinking agents, in most cases in the presence of catalysts.

The printing plates obtained with these silicone elastomer layers show good ink repellency in the non-image areas and good resistance of the ink-repellent silicone layer. The best image resolutions can be obtained with the diazonium salt layers that are preferred as the light-sensitive layers. But these layers, which are in most cases highly hydrophilic, are difficult to combine precisely with the particularly ink-repellent and resistant silicone layers that are preferred. As a consequence, it is frequently impossible to find a solvent combination that resolves the non-image areas of the diazo layer without attacking the image areas and, simultaneously, that fully and cleanly removes the silicone elastomer layer from the non-image areas.

SUMMARY OF THE INVENTION

It is therefore an object of the present invention to provide a presensitized printing plate that is suitable for waterless offset printing and that makes possible long print runs with good ink-repellency of non-image areas and, at the same time, clean development with high image resolution.

It is also an object of the present invention to provide an easy-to-prepare, highly light-sensitive printing plate that successfully combines the high resolution associated with diazonium salt-based photosensitive layers with the ink-repellency of silicone elastomer overlayers.

In accomplishing the foregoing objects, there has been provided, in accordance with one aspect of the present invention, a light-sensitive printing plate for waterless offset printing, comprised of (a) a layer carrier; (b) a light-sensitive layer provided on the layer carrier that contains a diazonium salt polycondensation product; and (c) an ink-repellent crosslinked silicone elastomer layer provided on the light-sensitive layer, wherein the diazonium salt polycondensation product comprises recurrent $A-N_2X$ and B units which are mutually linked by bridge members derived from carbonyl compounds capable of condensation, A being the radical of an aromatic diazonium compound capable of condensation with formaldehyde, and B being the radical of a compound that is free of diazonium groups and that is capable of condensation with formaldehyde.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the printing plate of the present invention, the diazonium salt polycondensation product preferably comprises recurrent $A-N_2X$ and B units which are mutually linked by bridge members, especially methylene groups, which are derived from carbonyl compounds capable of condensation, A being the radical of an aromatic diazonium compound capable of condensation with formaldehyde, and B being the radical of a compound which is free of diazonium groups and is capable of condensation with formaldehyde. Among the compounds particularly preferred as a source for radical B are an aromatic amine, a phenol, a phenol ether, an aromatic thioether, an aromatic hydrocarbon, an aromatic heterocyclic compound, and an organic acid amide.

Those products that are particularly preferred as the diazonium salt polycondensation products comprise $A-N_2X$ units derived from compounds represented by the formula $$(R^1-R^3-)_pR^2-N_2X$$

in which
X is the anion of the diazonium compound,
p is an integer from 1 to 3,
$R^1$ is an aromatic radical with at least one position capable of condensation with an active carbonyl compound,
$R^2$ is an unsubstituted or substituted phenylene group, and
$R^3$ is a single bond or one of the groups:
—$(CH_2)_q$—$NR^4$—,
—O—$(CH_2)_r$—$NR^4$—,
—S—$(CH_2)_r$—$NR^4$—,
—S—$CH_2CO$—$NR^4$—,
—O—$R^5$—O—,
—O—
—S— or
—CO—$NR^4$—
in which
q is a number from 0 to 5,
r is a number from 2 to 5,
$R^4$ is hydrogen, an alkyl group having 1 to 5 carbon atoms, an aralkyl group having 7 to 12 carbon atoms or an aryl group having 6 to 12 carbon atoms and
$R^5$ is an arylene group having 6 to 12 carbon atoms.

The diazonium salt polycondensation products of the sort described above are disclosed in U.S. Pat. Nos. 3,867,147 and 3,849,392. Additional suitable condensation products of this type are described in European patent application No. 126,875.

The light-sensitive layer used in the present invention can consist essentially of the diazonium salt condensation product alone. Preferably, the layer also contains a polymeric binder. The binders used are preferably water-insoluble polymers, such as epoxy resins, urea and melamine resins, ketone resins, vinyl acetal homopolymers and copolymers, polyvinyl acetals, such as polyvinyl formals and polyvinyl butyrals, polyurethanes, polyacrylates, polymethacrylates and cellulose esters. Among the aforementioned polymers, the polyvinyl acetals, in particular those that also contain free vinyl alcohol and vinyl ester units, are preferred.

It is also possible to use binders that are insoluble in water but soluble in aqueous-alkaline solutions. Exemplary binders of this sort are phenolic resins, polyvinylphenols, polysulfonylurethanes, acrylic and methacrylic acid copolymers, styrene/maleic anhydride copolymers and reaction products of polymers containing OH groups, in particular polymers containing vinyl alcohol units, with anhydrides of poly-basic carboxylic acids, in particular of dicarboxylic or tricarboxylic acids. The last-mentioned polymers are particularly preferred. They are described in European patent application No. 152,819.

Examples of suitable acid anhydrides are:
maleic anhydride and derivatives, such as dimethylmaleic anhydride or citraconic anhydride,
succinic anhydride and derivatives, for example, methylsuccinic anhydride,
glutaric anhydride and derivatives,
3-oxo-glutaric anhydride and derivatives,
phthalic anhydride and substitution products,
partially or fully hydrogenated phthalic anhydrides, for example, hexahydrophthalic anhydride or cyclohexene-1,2-dicarboxylic acid anhydride,
naphthalene-2,3-dicarboxylic acid anhydride or naphthalene-1,8-dicarboxylic acid anhydride and their substitution products,
bicyclic or polycyclic anhydrides formed by Diels-Alder reaction of a diene with maleic anhydride, for example, the addition products of furan, anthracene, 1,3-cyclohexadiene and cyclopentadiene and maleic anhydride.

The reaction products with maleic, phthalic, succinic and 3-oxa-glutaric anhydride are preferred.

The synthetic polymers containing hydroxyl groups can be, in particular, polymers with vinyl alcohol units, and also epoxide resins and saponified epoxide resins, copolymers of allyl alcohol or higher unsaturated alcohols, polyhydroxyalkyl acrylates and methacrylates, and similar polymers. Suitable polymers with vinyl alcohol units are partially saponified polyvinyl esters, polyvinyl acetals with free hydroxyl groups and corresponding reaction products of copolymers with vinyl ester, vinyl acetal or vinyl alcohol units.

The light-sensitive layers employed in the present invention generally contain 5 to 90% by weight, preferably 10 to 70% by weight, of diazonium compound and 10 to 95% by weight, preferably 30 to 90% by weight, of polymeric binder.

To stabilize the light-sensitive layer, it is advantageous to add a compound of acidic character to the layer. These can be mineral acids and strong organic acids, among which phosphoric acid, sulfuric acid, perchloric acid, boric acid and p-toluenesulfonic acid are preferred. Phosphoric acid is very particularly suitable.

The light-sensitive mixtures used in making the light-sensitive layers can also contains dyestuffs and/or pigments which can act as contrast agents. Dyestuffs which can be used are disclosed, for example, in U.S. Pat. Nos. 3,218,167 and 3,884,693. Particularly suitable are, for example, Victoria Pure Blue FGA, Renol Blue B2G-H (C.I. 74,160), Crystal Violet and Rhodamine 6 GDN (C.I. 45,160). Metanil Yellow (C.I. 13,065), Methyl Orange (C.I. 13,025) and phenylazodiphenylamine can be used for intensifying the image contrast after exposure.

The layer thickness of the light-sensitive layer is in general 0.2 to 3 μm, preferably 0.5 to 1.5 μm.

After the light-sensitive layer is applied to the layer carrier, the silicone elastomer layer is then applied to the light-sensitive layer. It can be applied from a solution in a nonpolar solvent, for example, aliphatic or aromatic hydrocarbons, in which the constituents of the light-sensitive layer are virtually insoluble under the coating conditions.

In principle, any silicone elastomer is suitable so long as it is sufficiently ink-repellent to permit offset printing without dampening solution. In the context of the present invention, "silicone elastomer" is to be understood, in accordance with the definition of Noll, *Chemie und Technologie der Silikone* ("Chemistry and Technology of Silicones") (Verlag Chemie 1968) at page 332, as a high-molecular, substantially linear diorganopolysiloxane, whereas the term "silicone rubber" is used to denote crosslinked or vulcanized products. In every case, a silicone elastomer solution is applied to the light-sensitive layer, dried and then crosslinked.

Suitable silicone elastomers are single-component and multicomponent types, such as are described in German Offenlegungsschriften Nos. 2,350,211, 2,357,871 and 2,359,102. The single-component silicone elastomers are based on polysiloxanes which contain, for example, terminal acetyl, oxime, alkoxy or amino groups or hydrogen atoms. The remainder of the polysiloxane consists essentially of a dimethylpolysiloxane chain. To a relatively small extent, the methyl groups can also be replaced by other alkyl groups, by halogenoalkyl groups or substituted or unsubstituted aryl groups. The terminal functional groups are easily hydrolyzable and harden under the action of moisture within a period ranging from a few minutes to several hours.

The multicomponent silicone elastomers can be crosslinkable by addition or by condensation. The addition-crosslinkable types generally contain polysiloxanes with alkenyl groups as substituents and those with hydrogen atoms bonded to silicon. They are crosslinked at temperatures above 50° C. in the presence of platinum catalysts. They have the advantage that they crosslink rapidly at an elevated temperature, for example, about 100° C. On the other hand, the processing period (pot life) of these systems can be relatively short.

The mixtures crosslinkable by condensation contain diorgano-polysiloxanes with reactive end groups, for example, OH groups and acetoxy groups. These are crosslinked with reactive silanes or oligosiloxanes in the presence of catalysts. These combinations also react relatively rapidly and, therefore, have a limited pot life.

Multicomponent silicone elastomers which are crosslinkable by addition or condensation, such as are described in German patent Nos. 2,119,120 and 2,654,893, are employed to particular advantage in the present invention. On the one hand, these preferred silicone elastomers are combinations, crosslinkable by condensation, of (a) diorganopolysiloxanes with terminal Si-OH groups, (b) organopolysiloxanes which contain hydrogen atoms bonded to silicon, but no amino groups, (c) amino-substituted organosilicon compounds and (d) organo-tin compounds acting catalytically. On the other hand, the preferred silicone elastomers also include multicomponent silicone elastomers, crosslinkable by addition, of (a) diorganopolysiloxanes with terminal Si-vinyl groups, (b) organopolysiloxanes with at least three hydrogen atoms bonded to silicon, (c) platinum complexes of vinylsiloxanes and (d) an agent that retards the addition of silicon-bonded hydrogen atoms to aliphatic multiple bonds at room temperature.

After application, the silicone elastomers are crosslinked as a layer in a known manner, by the action of moisture or by themselves at room temperature or elevated temperature, to give a silicone rubber which is essentially insoluble in an organic solvent. The finished silicone rubber layer has in general a thickness from 1 to 20 μm, preferably from 2 to 10 μm. As previously mentioned, the elastomer coating is applied in general from non-polar solvents, for example, paraffin hydrocarbons which only slightly dissolve, or do not dissolve at all, the light-sensitive layer underneath.

The preferred multicomponent silicone elastomers have the advantage that printing plates prepared with them, on printing without dampening solution, show a substantially lower tendency to scumming than those that have been prepared with normal single-component silicone elastomers. The scratch resistance of the surface of the hardened silicone rubber is also increased in the case of the preferred types of compound.

The use of the diazonium salt condensation products described above makes it possible to employ the above-mentioned, particularly advantageous silicone elastomers. Layer combinations of the diazonium salt condensation products and the preferred, particularly resistant and ink-repellent multicomponent silicone elastomers can be easily and cleanly developed with organic solvents and, if appropriate, also with added water. Since the diazonium salt condensation products employed according to the present invention can be combined readily with the most diverse organic polymers as the binder, it is possible to obtain well-adhering combinations even with those silicone rubber layers that heretofore allowed only limited combinations, if any, with the conventionally used condensation products of diazonium salts. It is particularly advantageous in this case to employ those diazonium salt condensation products which dissolve in organic solvents, but are virtually insoluble in water. This is achieved, in a known manner, via the choice of a suitable anion for the diazonium salt.

The printing plates according to the present invention can also be prepared advantageously with single-component silicone elastomers. With these combinations, better mutual adhesion of the layers and better development ability are also obtained than in the case of the hitherto known and conventional diazonium salt condensates. However, substantial advantages are obtained, as mentioned above, with the preferred multicomponent silicone elastomers.

The layer carriers used in the present invention are typically comprised of metals. The following can be employed for offset printing plates: bright-rolled, mechanically or electrochemically roughened and, if appropriate, anodized aluminum which, in addition, may also have been pretreated chemically, for example, with a polyvinylphosphonic acid, silicates, phosphates, hexafluorozirconates or with hydrolyzed tetraethyl orthosilicate. Other suitable metals are steel and chromium. In contrast to conventional planographic printing plates, it is not necessary for the carrier surface to be hydrophilic; accordingly, it is also possible to use copper, brass and other oleophilic metals to advantage as the carrier surface. Plastic sheets, such as polyester, polycarbonate, polyimide and cellulose acetate sheets, can likewise be used, the surface of which may have been pretreated, if necessary, for improving wettability by printing ink. Rubber-elastic carrier materials are also suitable; such carriers allow printing in direct planographic printing.

In the case of the printing forms prepared from material according to the invention, the carrier material serves as the ink-bearing material, in contrast to conventional printing forms. The silicone rubber layer which remains in place after exposure and development serves as the image background and, in the dry state, has an ink-repellent action. For printing, both conventional oil-based printing inks and special hydrophilic printing inks, such as have been developed for waterless offset printing and reverse offset printing and are commercially available, can here be used. Most of the usual layer-carrier surfaces, for example, roughened or anodically oxidized aluminum, are highly hydrophilic, so hydrophilic printing inks are used to advantage.

For developing exposed printing plates prepared in accordance with the present invention, mixtures of organic solvents with one another or with water are preferably used. In this case, one constituent is chosen that is able to swell the silicone rubber layer, and another constituent is chosen that selectively dissolves the exposed diazonium salt layer. In most cases, the unexposed layer areas are dissolved, whereas the exposed areas remain. In the case of certain combinations of condensation products, binders and developers, however, it is also possible selectively to dissolve the exposed layer areas, that is, to obtain a negative-working printing plate. Examples of suitable developers are combinations of paraffin hydrocarbons with polar solvents, such as esters, ketones, or alcohols. Combinations of water-miscible solvents, such as lower alcohols or ketones, and water and also suitable.

Illustrative examples of preferred embodiments of the present invention are described below. Unless otherwise stated, the quantity ratios and percentage data relate to the weight. The silicone elastomer solutions and the diazonium salt condensation products used in the examples are first described.

Silicone elastomer solutions used (A) A commercially-available, 60% solution of a silicone elastomer, crosslinking at room temperature, in toluene (viscosity about 350 mPa.s at 23° C.) was diluted in a ratio of 1:4 with an isoparaffin mixture of boiling range 116°–136° C. under normal pressure (Isopar E).

(B) 84 parts by weight of a 50% solution of the reaction product of 1.99 parts by weight of a dimethylpolysiloxane having terminal OH groups (OH group content 3.5%) and 1 part by weight of 3-(2-amino-ethylamino)-propyltrimethoxy-silane were added to a solution of (i) 5 parts by weight of a dimethylpolysiloxane having terminal OH groups bonded to silicon and a Brabender plasticity of 5.8 kNm and (ii) 0.3 part by weight of a solution of a methylhydrogenpolysiloxane having terminal trimethylsiloxy groups and a viscosity of 0.4 $cm^2/s$ at 25° C. in 9.7 parts by weight of toluene. 0.3 part by weight of dibutyl-tin diacetate was then added, and the whole was mixed. The mixture could be processed within a period of up to 24 hours.

(C) 0.4 part by weight of a mixture of vinyltrimethoxysilane and 3-glycidyloxy-propyl-trimethoxysilane was added to solution B and mixed with it.

(D) 10 parts by weight of a dimethylpolysiloxane having terminal vinyldimethylsiloxane units and a viscosity of 400 mPa·s at 25° C. were mixed with (i) 0.025 part by weight of 2-methyl-3-butyn-2-ol, (ii) 0.03 part by weight of a mixture, described below, of a platinum complex of vinylsiloxane and a diluent, (iii) 0.09 part by weight of a copolymer of 4 mol% of trimethylsiloxane units, 72 mol% of methylhydrogensiloxane units and 24 mol% of dimethylsiloxane units, having a viscosity of 50 mPa·s at 25° C. and an Si-bonded hydrogen content of 1.36%, and (iv) 88.9 parts by weight of Isopar E. The mixture could be processed within a period of up to 24 hours after the preparation.

The platinum complex mixture was prepared as follows: 20 parts by weight of sodium bicarbonate were added to a mixture of 10 parts by weight of $H_2PtCl_6 \cdot 6H_2O$, 20 parts by weight of 1,3-divinyl-1,1,3,3-tetramethyldisiloxane and 50 parts by weight of ethanol. The mixture was heated to the boil under reflux for 30 minutes with stirring, and left to stand for 15 hours and afterwards filtered. The volatile constituents were distilled off from the filtrate under 16 mbar. As the residue, 17 parts by weight of a liquid were obtained which was dissolved in benzene. The solution was filtered and the benzene was distilled off from the filtrate. The residue was mixed with a dimethylpolysiloxane diluent, having terminal vinyldimethylsiloxane units and a viscosity of 1.4 Pa.s at 23° C., in such a quantity that the mixture contained 1% by weight of platinum, calculated as the element.

Diazonium salt condensation products used (1) Condensation product of diphenylamine-4-diazonium salt and formaldehyde, isolated as the tetrachlorozincate (comparison).

(2) Condensation product of diphenylamine-4-diazonium salt and formaldehyde, precipitated with 2-hydroxy-4-methoxy-benzophenone-5-sulfonic acid (comparison).

(3) Condensation product of 1 mol of 3-methoxy-diphenylamine-4-diazonium salt and 1 mol of 4,4'-bis-methoxymethyl-diphenyl ether, isolated as the mesitylenesulfonate.

(4) Condensation product of 1 mol of 3-methoxy-diphenylamine-4-diazonium salt, 1 mol of 4-methyl-4'-methoxymethyl-diphenyl ether and 1 mol of 4,4'-bis-methoxymethyl-diphenyl ether, precipitated as the mesitylenesulfonate.

EXAMPLE 1 (COMPARISON EXAMPLE)

A 5% aqueous solution of diazonium salt condensation product (1) was applied to an electrolytically roughened and anodically oxidized aluminum plate. After drying, the layer weight was 1 $g/m^2$.

Various top layers of silicone elastomer were applied to this plate:

(a) Solution A was applied and dried for 10 minutes at 100° C. The dried silicone elastomer layer had a layer weight of 3.5 $g/m^2$. After storage for 24 hours, the plate was exposed under an original for 60 seconds with a metal halide lamp (5 kW). The plate was developed once with isopropanol/water (2:1) and, in a second experiment, with a 1:1 mixture of isoparaffins of boiling range 176°–188° C. (Isopar H) and acetone.

(b) Solution B was applied and dried for 1 minute at 100° C. The further treatment was as described under (a) above.

(c) Solution D was used for coating; the further treatment was as under (b).

EXAMPLE 2 (COMPARISON)

Coating with diazonium salt condensation product (2) was not feasible, because it was not sufficiently soluble in any of the solvents tested—water, acetone, dimethyl sulfoxide and 2-methoxy-ethanol—and not even in a mixture of tetrahydrofuran, dimethylformamide and methanol.

EXAMPLE 3

The aluminum plate described in Example 1 was coated with a 5% solution of diazonium salt condensation product (3) in 2-methoxyethanol. The layer weight after drying was 1 $g/m^2$. The plates obtained were provided with top layers as in 1a to 1c and then exposed as in Example 1. All the plates were developed with a 1:1 mixture of Isopar H and acetone.

The following table shows the developing ability of the layers from Examples 1 and 3:

|   | Example 1 | | Example 3 |
|---|---|---|---|
|   | Isopropanol/water | Isopar H/acetone | Isopar H/acetone |
| a | adequately developed | well developed | well developed |
| b | not developed | not developed | well developed |
| c | Layer not solid | | well developed |

EXAMPLE 4

3 parts by weight of diazonium salt condensation product (3) and 3 parts by weight of a polyvinyl butyral having a molecular weight which ranged from 70,000 to 80,000 and containing 71% of vinyl butyral units, 2% of vinyl acetate units and 27% of vinyl alcohol units were dissolved in 93.68 parts by weight of 2-methoxyethanol. 0.3 part by weight of phthalocyanine and 0.02 part by weight of phenylazodiphenylamine were added to the solution. The solution was applied to the carrier described in Example 1 and was dried. The layer weight was 1 g/m$^2$. Top layers of the silicone elastomers A, B and D were applied to different samples of the plate. After 25 seconds' exposure as in Example 1 and development with 1:1 Isopar H/acetone, printing forms with good resolution were obtained.

Printing was carried out with commercially available oil-based printing ink, prints of good quality being obtained. Similarly good results were also attained with a hydrophilic printing ink which had been prepared as follows:

Mixed with one another were 40 parts by weight of an aqueous emulsion of alkali-soluble acrylate polymer, having a solids content of 40% by weight, 20 parts by weight of propylene glycol, 4 parts by weight of a triethanolamine, 4 parts by weight of a 35% methylsilicone oil emulsion, 4 parts by weight of mineral oil of boiling range 190°–250° C., and 8 parts by weight of starch ether. 20 parts by weight of an aqueous pigment paste containing 45% by weight of copper phthalocyanine pigment were added to this mixture. The mass was dispersed on a three-roll mill to give a homogeneous printing ink.

EXAMPLE 5

Example 4 was repeated, but with the difference that, instead of the polyvinyl butyral, the same quantity of the reaction product of 50 parts by weight of this polyvinyl butyral with 4 parts by weight of maleic anhydride was used. Moreover, 0.18 part by weight of 85% phosphoric acid was added to the coating solution. After development as in Example 4, printing forms with very good resolution were obtained. The print runs were as follows:
 a: more than 10,000
 b: more than 50,000
 c: more than 15,000

EXAMPLE 6

Example 5 was repeated, but with the difference that, in place of the diazonium salt polycondensation product used therein, the same quantity of product (4) was employed. Printing forms with good resolution were obtained with the top layers B and D.

EXAMPLE 7

Example 5 was repeated, with the difference that, as the layer carrier, a polyethylene terephthalate sheet was used which, for adhesion promotion, had been pretreated with a dispersion of polyvinylidene chloride in aqueous trichloroacetic acid. Printing forms with good resolution were again obtained.

EXAMPLE 8

A plate of bright-rolled aluminum was pretreated with a 2% solution of 3-(2-amino-ethylamino)-propyl-trimethoxysilane in Isopar E. It was coated with the light-sensitive coating solution indicated in Example 4. A top layer of solution C was then applied. The plate was exposed imagewise and developed with a 65:30:5 mixture of Isopar H, 1-methoxy-propan-2-ol and diethylene glycol dibutyl ether. A printing form with good resolution was obtained.

EXAMPLES 9–14

The procedure followed was as in Example 4, except that the following binders were used instead of the polyvinyl butyral:

| Example | Binder |
| --- | --- |
| 9 | Copolymer of vinyl chloride, vinyl acetate and about 1% of maleic acid (Hostaflex M 131) |
| 10 | Aromatic, non-reactive linear polyurethane, viscosity of a 30% solution in butanone 1000 ± 500 mPa.s (shear rate D = 16.3 s$^{-1}$) at 20° C. (Desmolac 2100) |
| 11 | Cresol/formaldehyde novolak, melting range 105–120° C. according to DIN 53181 |
| 12 | Hydrogenated condensation product of an aliphatic/aromatic ketone with formaldehyde (SK synthetic resin) |
| 13 | Reaction product of the polyvinyl butyral from Example 4 with 8% of its weight of phthalic anhydride |
| 14 | Reaction product of the polyvinyl butyral from Example 4 with about 8% of trimellitic anhydride |

The table which follows shows the development ability of the printing plates obtained:

| Example | a | b | c |
| --- | --- | --- | --- |
| 9 | good | good | good |
| 10 | good | good | good |
| 11 | good | good | poorer adhesion |
| 12 | poorer adhesion | good | good |
| 13 | good | good | good |
| 14 | good | good | good |

EXAMPLE 15

The procedure followed was as in Example 5, with the exception that a 1:1 mixture of Isopar H/isooctanol was used for development. Printing forms of good resolution were obtained.

EXAMPLE 16

The procedure followed was as in Example 5, with the exception that the rubber blanket of an offset printing press was used as the layer carrier. The printing form obtained was suitable for printing as in the other examples, without dampening solution.

EXAMPLE 17

The procedure followed was as in Example 4, with the exception that, in place of the polyvinyl butyral, the same quantity of the reaction product of the polyvinyl butyral indicated in Example 4 and propenylsulfonyl isocyanate was employed as the binder. After imagewise exposure and development with 1:1 Isopar H/ethyl acetate, the exposed areas were dissolved away, that is, a negative-working printing form for waterless offset printing was obtained.

What is claimed is:

1. A light-sensitive printing plate for waterless offset printing, comprised of (a) a layer carrier; (b) a light-sensitive layer provided on said layer carrier that contains a diazonium salt polycondensation product; and (c) an ink-repellent crosslinked silicone elastomer layer provided on said light-sensitive layer, wherein said diazonium salt polycondensation product comprises recurrent $A-N_2X$ and B units which are mutually linked by bridge members derived from carbonyl compounds capable of condensation, A being the radical of an aromatic diazonium compound capable of condensation with formaldehyde, and B being the radical of a compound that is free of diazonium groups and that is capable of condensation with formaldehyde.

2. A light-sensitive printing plate as claimed in claim 1, wherein said bridge members are methylene groups.

3. A light-sensitive printing plate as claimed in claim 1, wherein said compound for radical B is selected from the group consisting of an aromatic amine, a phenol, a phenol ether, an aromatic thioether, an aromatic hydrocarbon, an aromatic heterocyclic compound and an organic acid amide.

4. A light-sensitive printing plate as claimed in claim 1, wherein said $A-N_2X$ units are derived from compounds represented by the formula $$(R^1—R^3—)_pR^2—N_2X$$

where
X is the anion of the diazonium compound,
p is an integer from 1 to 3,
$R^1$ is an aromatic radical with at least one position capable of condensation with an active carbonyl compound,
$R^2$ is a phenylene group,
$R^3$ is a single bond or one of the groups:
—$(CH_2)_q$—$NR^4$—,
—O—$(CH_2)_r$—$NR^4$—,
—S—$(CH_2)_r$—$NR^4$—,
—S—$CH_2CO$—$NR^4$—,
—O—$R^5$—O—,
—O—
—S— or
—CO—$NR^4$—
in which
q is a number from 0 to 5,
r is a number from 2 to 5,
$R^4$ is hydrogen, an alkyl group having 1 to 5 carbon atoms, an aralkyl group having 7 to 12 carbon atoms or an aryl group having 6 to 12 carbon atoms and
$R^5$ is an arylene group having 6 to 12 carbon atoms.

5. A light-sensitive printing plate as claimed in claim 1, wherein said light-sensitive layer further contains a polymeric binder.

6. A light-sensitive printing plate as claimed in claim 5, wherein said binder contains vinyl acetal units.

7. A light-sensitive printing plate as claimed in claim 5, wherein said binder is a reaction product of (i) an intramolecular anhydride of an organic polycarboxylic acid with (ii) a synthetic polymer which contains hydroxyl groups but no other functional groups capable of reacting with acid anhydrides.

8. A light-sensitive printing plate as claimed in claim 7, wherein said organic polycarboxylic acid is a dicarboxylic or tricarboxylic acid.

9. A light-sensitive printing plate as claimed in claim 5, wherein said light-sensitive layer contains 5 to 90% by weight of diazonium salt polycondensation product and 10 to 95% by weight of binder.

10. A light-sensitive printing plate as claimed in claim 1, wherein said silicone elastomer is a multicomponent elastomer of the addition type or the condensation type.

11. A light-sensitive printing plate as claimed in claim 1, wherein said light-sensitive layer has a thickness ranging from about 0.2 to 3 μm, and said silicone elastomer layer has a thickness ranging from about 1 to 20 μm.

* * * * *